(12) United States Patent
Kurosawa

(10) Patent No.: US 7,615,474 B2
(45) Date of Patent: Nov. 10, 2009

(54) METHOD FOR MANUFACTURING SEMICONDUCTOR DEVICE WITH REDUCED DAMAGE TO METAL WIRING LAYER

(75) Inventor: Yasunori Kurosawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/942,823

(22) Filed: Nov. 20, 2007

(65) Prior Publication Data

US 2008/0119045 A1 May 22, 2008

(30) Foreign Application Priority Data

Nov. 22, 2006 (JP) .............................. 2006-315951
Nov. 7, 2007 (JP) .............................. 2007-289515

(51) Int. Cl.
*H01L 23/522* (2006.01)
(52) U.S. Cl. ................ 438/584; 438/652; 257/E21.575
(58) Field of Classification Search ................ 438/652, 438/597, 584, 455, 460, 758, 622, 618; 257/E21.476, 257/E21.459, E21.04, E21.002, 499, 758, 257/750, 741, 734, E21.461–E21.475, E21.575
See application file for complete search history.

(56) References Cited

U.S. PATENT DOCUMENTS

| | | | | |
|---|---|---|---|---|
| 2002/0063332 | A1* | 5/2002 | Yamaguchi et al. | 257/738 |
| 2004/0056340 | A1* | 3/2004 | Jobetto | 257/678 |
| 2006/0276021 | A1* | 12/2006 | Hee | 438/597 |
| 2007/0045793 | A1* | 3/2007 | Tanaka | 257/678 |

FOREIGN PATENT DOCUMENTS

| | | |
|---|---|---|
| JP | 2000-332034 | 11/2000 |
| JP | 2004-134480 | 4/2004 |
| JP | 2004-179507 | 6/2004 |
| JP | 2004-241673 | 8/2004 |
| JP | 2007-115770 | 5/2007 |

* cited by examiner

*Primary Examiner*—Matthew Smith
*Assistant Examiner*—Michele Fan
(74) *Attorney, Agent, or Firm*—Harness, Dickey & Pierce, P.L.C.

(57) ABSTRACT

A method for manufacturing a semiconductor device includes (a) forming a conductive film on a first surface having an electrode of a semiconductor substrate having an integrated circuit formed therein, the electrode being electrically coupled to the integrated circuit, such that the electrode is covered, forming a plating resist layer on the conductive film such that the plating resist layer has an opening portion exposing part of the conductive film, and forming a metal layer on the exposed part from the plating resist layer of the conductive film by electrolytic plating, the electrolytic plating being performed by applying an electric current to the conductive film; (b) removing the plating resist layer after the step (a); (c) forming a resin layer on a second surface opposite to the first surface of the semiconductor substrate after the step (a); and (d) removing the exposed part from the metal layer of the conductive film by etching with the metal layer as a mask while etching a surface of the metal layer by the etching, after the steps of (a), (b) and (c).

12 Claims, 7 Drawing Sheets

METHOD FOR MANUFACTURING SEMICONDUCTOR DEVICE WITH REDUCED DAMAGE TO METAL WIRING LAYER

The entire disclosure of Japanese Patent Application No. 2006-315951, filed Nov. 22, 2006, and No. 2007-289515, filed Nov. 7, 2007 are expressly incorporated by reference herein.

BACKGROUND OF THE INVENTION

1. Technical Field

Some aspects of the present invention relate to a method for manufacturing a semiconductor device.

2. Related Art

In recent years, as a demand for miniaturization of a semiconductor device has grown, a process for forming a metal layer used for a wire line or a bump on an active surface of a semiconductor wafer has been developed.

In the process, a thin semiconductor wafer is used to reduce the thickness of a semiconductor device in some cases.

In these cases, it is known to form a resin layer on the back surface of the thin semiconductor wafer for the purpose of reinforcement (JP-A-2000-332034).

However, the former technique may cause damage to a metal layer on an active surface when forming a resin layer on the back surface of a semiconductor wafer, and therefore a countermeasure thereto is needed.

SUMMARY

An advantage of some aspects of the invention is to manufacture a semiconductor device of high quality:

(1) A method for manufacturing a semiconductor device according to a first aspect of the invention (a) forming a conductive film on a first surface of a semiconductor substrate on which an electrode is formed, the semiconductor substrate having an integrated circuit, the electrode being electrically coupled to the integrated circuit, such that the electrode is covered by the conductive film, forming a plating resist layer on the conductive film such that the plating resist layer has an opening portion on a first part of the conductive film, and forming a metal layer on the first part of the conductive film by electrolytic plating, the electrolytic plating being performed by applying an electric current to the conductive film; (b) removing the plating resist layer after the step (a); (c) forming a resin layer on a second surface opposite to the first surface of the semiconductor substrate after the step (a); and (d) removing a second part of the conductive film by etching with the metal layer as a mask while etching a surface of the metal layer by the etching, after the steps (a), (b) and (c), the second part of the conductive film being exposed from the metal layer According to the first aspect of the invention, the surface of a metal layer is etched after a resin layer is formed.

Therefore, if the metal layer is damaged when the resin layer is formed, the damage can be removed.

(2) A method for manufacturing a semiconductor device according to a second aspect of the invention includes (a) forming a stress relaxation layer on a first surface of a semiconductor substrate on which an electrode is formed, the semiconductor substrate having an integrated circuit, the electrode being electrically coupled to the integrated circuit, forming a conductive film such that the stress relaxation layer and the electrode are covered by the conductive film, forming a plating resist layer on the conductive film such that the plating resist layer has an opening portion on a first part of the conductive film, and forming a metal layer on the first part of the conductive film by electrolytic plating, the electrolytic plating being performed by applying an electric current to the conductive film; (b) removing the plating resist layer after the step (a); (c) forming a resin layer on a second surface opposite to the first surface of the semiconductor substrate after the step (a); and (d) removing a second part of the conductive film by etching with the metal layer as a mask while etching a surface of the metal layer by the etching, after the steps (a), (b) and (c), the second part of the conductive film being exposed from the metal layer. According to the second aspect of the invention, the surface of a metal layer is etched after a resin layer is formed.

Therefore, if the metal layer is damaged when the resin layer is formed, the damage can be removed.

(3) A method for manufacturing a semiconductor device according to a third aspect of the invention includes (a) forming a metal layer in an opening portion of a plating resist layer formed on a conductive film, the conductive film being formed on a first surface of a semiconductor substrate, the opening portion being positioned on a first part of the conductive film; (b) removing the plating resist layer after the forming of the metal layer; (c) forming a resin layer on a second surface opposite to the first surface of the semiconductor substrate after the forming of the metal layer; and (d) removing a second part of the conductive film by etching with the metal layer as a mask after the forming of the metal layer, the removing of the plating resist layer and the forming of the resin layer.

In the foregoing method for manufacturing a semiconductor device, for example, using the metal layer as a mask in the step (d) allows patterning of a conductive film to be performed without using a new resist.

The foregoing method for manufacturing a semiconductor device makes it possible to manufacture a semiconductor device having such a configuration that a conductive film is interposed between the metal layer and the first surface of the semiconductor substrate.

With this configuration, it is possible to suppress the adhesion of the metal layer, the penetration of a component contained in the metal layer to the semiconductor substrate, and other drawbacks.

Further, the foregoing method for manufacturing a semiconductor device allows the surface of the metal layer to be etched by appropriately selecting a material for the metal layer or an etchant in the step (d).

This enables such a step to be positively utilized for removing an impurity attached to the metal layer before the step (d) or repairing the damage to the metal layer.

(4) A method for manufacturing a semiconductor device according to a fourth aspect of the invention includes (a) forming a metal layer in an opening portion of a plating resist layer formed on a conductive film formed so as to cover a first resin layer, the first resin layer being disposed on a first surface of a semiconductor substrate, the opening portion being positioned on a first part of the conductive film; (b) removing the plating resist layer after the forming of the metal layer); (c) forming a second resin layer on a second surface opposite to the first surface of the semiconductor substrate after the forming of the metal layer; and (d) removing the second part of the conductive film by etching with the metal layer as a mask after the forming of the metal layer, removing of the plating resist layer and the forming of the second resin layer.).

In the foregoing method for manufacturing a semiconductor device, for example, using the metal layer as a mask in the step (d) allows patterning of a conductive film to be performed without using a new resist.

The foregoing method for manufacturing a semiconductor device makes it possible to manufacture a semiconductor device having such a configuration that a conductive film is interposed between the metal layer and the first surface of the semiconductor substrate.

With this configuration, it is possible to suppress the adhesion of the metal layer, the penetration of a component contained in the metal layer to the semiconductor substrate, and other drawbacks.

Further, the foregoing method for manufacturing a semiconductor device allows the surface of the metal layer to be etched by appropriately selecting a material for the metal layer or an etchant in the step (d).

This enables such a step to be positively utilized for removing an impurity attached to the metal layer before the step (d) or repairing the damage to the metal layer.

(5) In this method for manufacturing a semiconductor device, part of the metal layer may be etched by the etching in the step (d).

(6) In this method for manufacturing a semiconductor device, the step (c) may be performed by mounting the semiconductor substrate on the support so as to bring the metal layer into contact with the support.

(7) In this method for manufacturing a semiconductor device, the step (b) may be performed after the step (c).

(8) In this method for manufacturing a semiconductor device, the metal layer may be formed so as to have a height equal to or less than a height of the plating resist layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
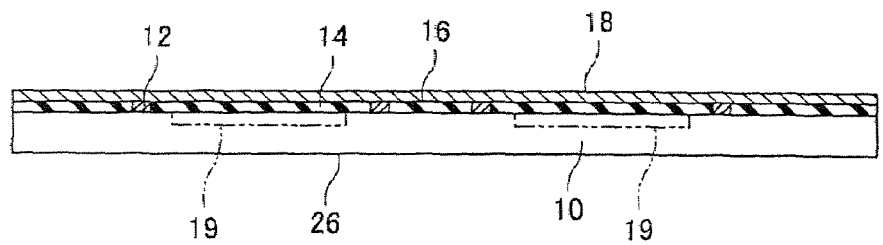
FIGS. 1A to 1D illustrate a method for manufacturing a semiconductor device according to a first embodiment of the invention.

Embodiments of the invention will be described.

First Embodiment

FIGS. 1A to 3 illustrate a method for manufacturing a semiconductor device according to a first embodiment of the invention.

In this embodiment, a semiconductor substrate (e.g. a semiconductor wafer made of Si (silicon)) 10 is used.

Formed in the semiconductor substrate 10 are integrated circuits 19.

Specifically, the integrated circuit 19 is formed in one surface of the semiconductor substrate 10 by well-known semiconductor processes.

The integrated circuit 19 is made within one surface layer of the semiconductor substrate 10.

An electrode 12 is formed to be electrically coupled to the integrated circuit 19 through internal wiring formed in the semiconductor substrate, and a passivation film 14 is formed such that at least part of the electrode 12 is exposed.

In other words, part exposed from the passivation film 14 of a wire coupled from the integrated circuit 19 constitutes the electrode 12.

The passivation film 14 is often made of an inorganic material (e.g. an inorganic oxide such as Si).

As illustrated in FIG. 1A, a conductive film 18 having the electrode 12 electrically coupled to the integrated circuit 19 is formed so as to cover the electrode 12 on a first surface (the front surface of the passivation film 14) 16.

The conductive film 18 is composed of at least one layer, and may be composed of a plurality of layers.

For example, a base layer formed of a mixed material including titanium and tungsten is formed on the passivation film 14, and a skin layer made of the same metal (e.g. copper) as that deposited by electrolytic plating, which will be described later, may be formed on the base layer. The conductive film 18 can be formed by sputtering.

Figure 1B:
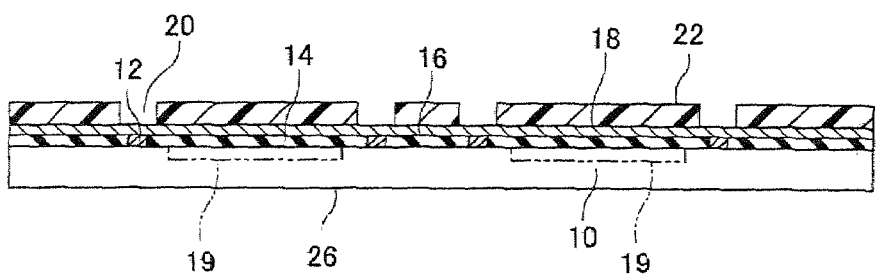

As illustrated in FIG. 1B, a plating resist layer 22 is formed to form an opening 20 on the conductive film 18 such that part of the conductive film 18 is exposed.

The plating resist layer 22 can be formed of a photosensitive resin.

The photosensitive resin may be an ultraviolet (UV) curing resin, but curing can be easily performed by using a thermosetting resin.

A photosensitive resin precursor layer is formed on the conductive film 18, an opening 20 is formed by photolithography including exposure and development, and the layer is cured, thereby forming the plating resist layer 22.

The opening 20 is formed in such a manner so as to overlap the electrode 12.

The opening 20 may be larger than the electrode 12 to cover the entire electrode 12, and may also be formed such that part of the opening 20 covers part of the electrode 12 and the other part of opening 20 does not cover the electrode 12.

Note that when the photosensitive resin precursor layer is cured, the opening 20 may be formed to have a shape of taper that extends outward such that the inside surface of the opening 20 is inclined.

In other words, an opening on a surface side opposite to that facing the semiconductor substrate 10 of the plating resist layer 22 may be larger than an opening on a surface side facing the semiconductor substrate 10 of the plating resist layer 22.

Figure 1C:
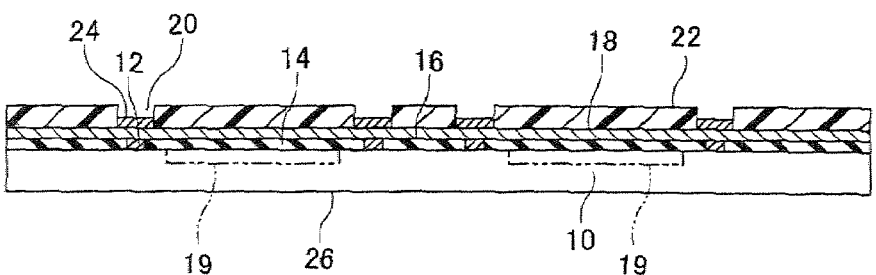

As illustrated in FIG. 1C, a metal layer 24 is formed on a portion of the conductive film 18 exposed from the plating resist layer 22 by electrolytic plating that applies an electric current to the conductive film 18.

The conductive film 18 is used as an electrode in electrolytic plating.

The metal layer 24 is made of, e.g., copper.

The metal layer 24 is formed to have the height that does not exceed the height of the plating resist layer 22 (that is, not protruding from the opening 20), which allows the metal layer 24 to be formed in a width of the opening 20.

Figure 1D:
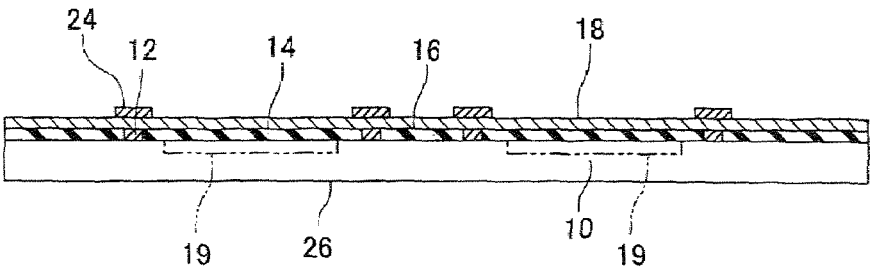

As illustrated in FIG. 1D, the plating resist layer 22 is removed.

Next, a resin layer 28 is formed on a second surface 26, which is on a side opposite to that of the first surface 16, of the semiconductor substrate 10.

This process is performed with the semiconductor substrate 10 supported with (or mounted on) a support 30.

Specifically, the first surface 16 is turned toward the support 30 to bring the metal layer 24 into contact with the support 30.

The conductive film 18 may come into contact with the support 30.

Figure 2A:
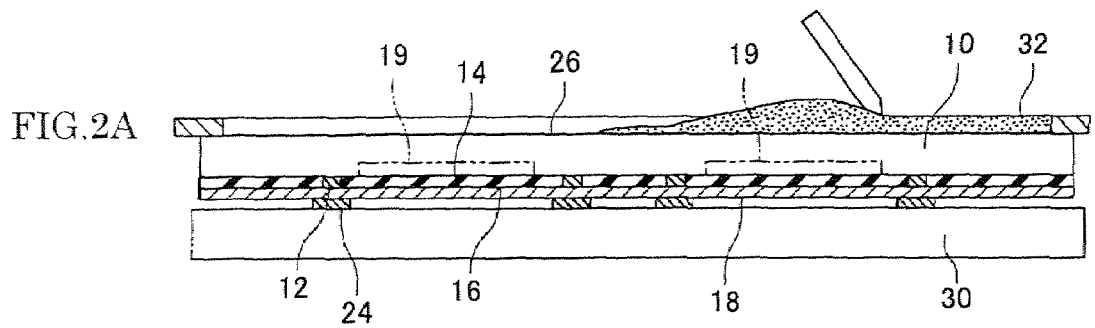
FIGS. 2A to 2C illustrate the method for manufacturing a semiconductor device according to the first embodiment of the invention.

As illustrated in FIG. 2A, a resin precursor layer 32 is formed on the second surface 26.

The resin precursor may be a UV curing resin, but curing can be easily performed by using a thermosetting resin.

Formation of the precursor layer 32 by screen printing wastes less material, but this does not prohibit the precursor layer 32 from being formed by spin coating.

Figure 2B:
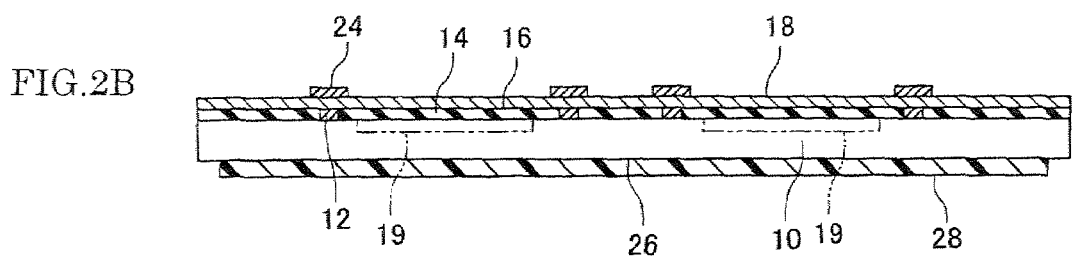

The resin precursor layer 32 is cured to form the resin layer 28 (see FIG. 2B).

For example, if a thermosetting resin is used as the resin precursor layer 32, the resin precursor layer 32 is heated and cured to form the resin layer 28.

Alternatively, the resin layer 28 may be provided by adhering a tape or a sheet.

Providing the resin layer 28 enables the second surface 26 of the semiconductor substrate 10 to be protected, and also enables the thin semiconductor substrate 10 to be reinforced.

Figure 2C:
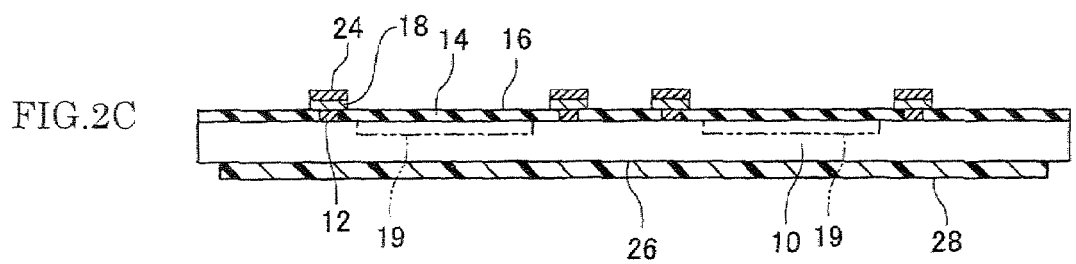

As illustrated in FIG. 2C, a portion of the conductive film 18 exposed from the metal layer 24 is removed by etching with the metal layer 24 functioning as a mask.

At this point, this etching process also etches the surface of the metal layer 24.

According to this embodiment, the surface of the metal layer 24 is etched after the resin layer 28 is formed.

Therefore, if the metal layer 24 is damaged when the resin layer 28 is formed, the damage can be removed.

An oxide film on the metal layer 24 formed during curing of the resin precursor layer 32 in the formation process of the resin layer 28 can also be removed.

In this embodiment, a bump is formed of the metal layer 24 and the conductive film 18 on the electrode 12.

Figure 3:
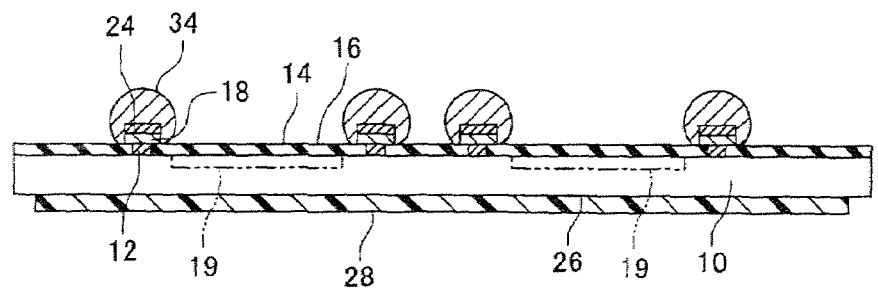
FIG. 3 illustrates the method for manufacturing a semiconductor device according to the first embodiment of the invention.

A illustrated in FIG. 3, an external terminal 34 is formed on the metal layer 24.

The external terminal 34 may be formed by soldering.

For example, cream solder may be applied onto the metal layer 24, and melted such that the cream solder is formed to be ball-shaped by means of surface tension.

In this embodiment, the resin layer 28 is formed before formation of the external terminal 34.

It is therefore unnecessary to devise a measure for supporting the semiconductor substrate 10 so as to avoid the external terminal 34.

This allows processes to be simplified.

Figure 4:
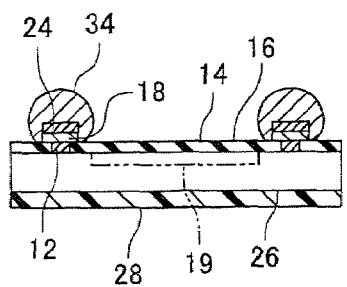
FIG. 4 illustrates a semiconductor device manufactured by the method according to the first embodiment of the invention.

Then, the semiconductor substrate 10 is cut (dicing or scribing), and thus a semiconductor device (a flip-chip type semiconductor device) can be obtained as illustrated in FIG. 4.

Modification of First Embodiment

Figure 5A:
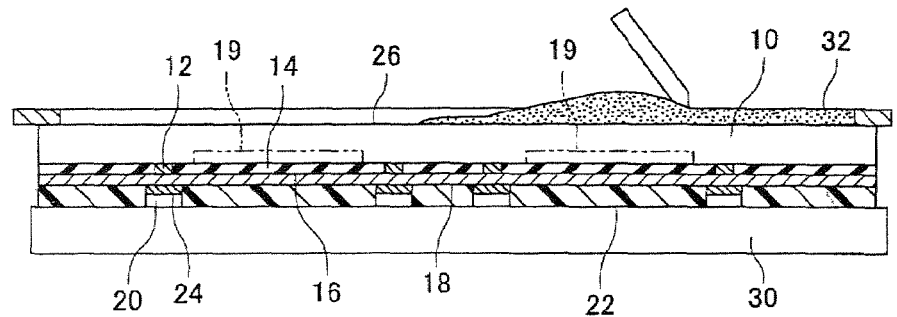
FIGS. 5A and 5B illustrate a modification of the first embodiment of the invention.
Figure 5B:
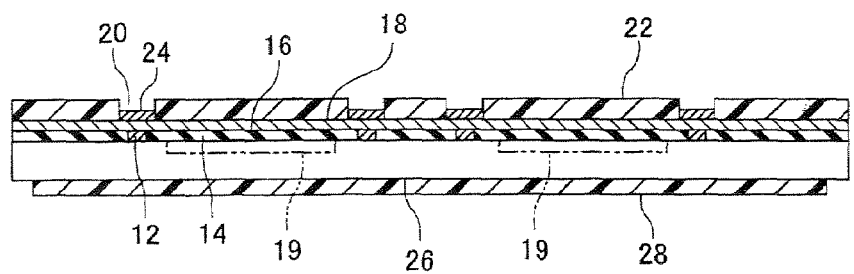

FIGS. 5A and 5B illustrate a modification of the first embodiment of the invention.

In this modification, the resin layer 28 is formed with the plating resist layer 22 having the opening 20 left without being removed as illustrated in FIG. 5A.

Specifically, the plating resist layer 22 is brought into contact with the support 30.

If the metal layer 24 is lower than the plating resist layer 22 in such a manner as not to protrude from the opening 20, the metal layer 24 will not come into contact with the support 30.

This can prevent the metal layer 24 from being damaged.

Regarding formation processes of the resin layer 28, the content of description with reference to FIG. 2A can be applied to this modification.

As illustrated in FIG. 5B, after the resin layer 28 is formed, the plating resist layer 22 is removed.

This modification can achieve the same effect as that described in the foregoing first embodiment.

Second Embodiment

FIGS. 6A to 9 illustrate a method for manufacturing a semiconductor device according to a second embodiment of the invention.

Figure 6A:
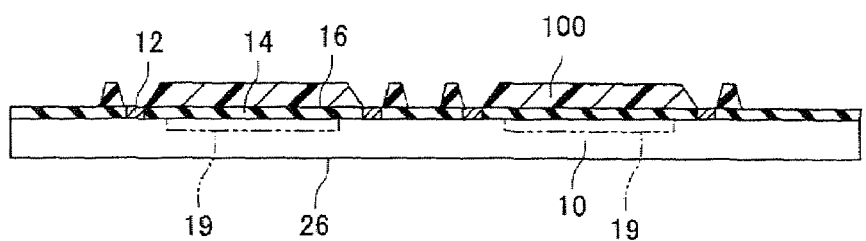
FIGS. 6A to 6E illustrate a method for manufacturing a semiconductor device according to a second embodiment of the invention.

As illustrated in FIG. 6A, a stress relaxation layer 100 is formed on the first surface 16 having the electrode 12, which is electrically coupled to the integrated circuit 19 of the semiconductor substrate 10 in which integrated circuits are formed.

The content of description on the semiconductor substrate 10, the integrated circuit 19, the electrode 12 and the first surface 16 in the first embodiment is applicable in this embodiment.

Further, the described content on the passivation film 14 is also applied to this embodiment.

The stress relaxation layer 100 is formed to avoid at least part of the electrode 12.

For example, the stress relaxation layer 100 may be formed with a photosensitive resin by applying photolithography.

The stress relaxation layer 100 may also be formed using a thermosetting resin.

The side surface of the stress relaxation layer 100 may be inclined.

This inclined surface is formed by thermal contraction of a thermosetting resin precursor.

If the stress relaxation layer 100 is formed avoiding a cutting line of the semiconductor substrate 10, which will be described later, clogging of a cutter (or a scriber) can be prevented.

Figure 6B:
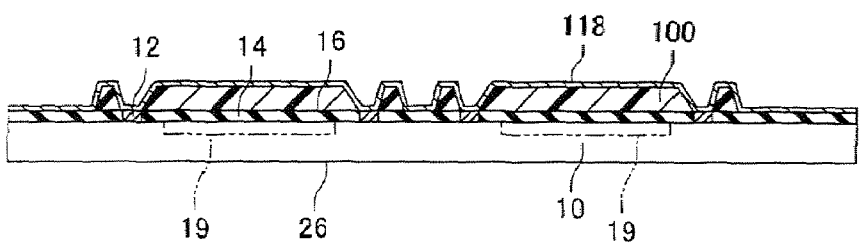

As illustrated in FIG. 6B, a conductive film 118 is formed to cover the stress relaxation layer 100 and the electrode 12.

The content of description on the conductive film 18 with reference to FIG. 1A is applicable to the conductive film 118.

Figure 6C:
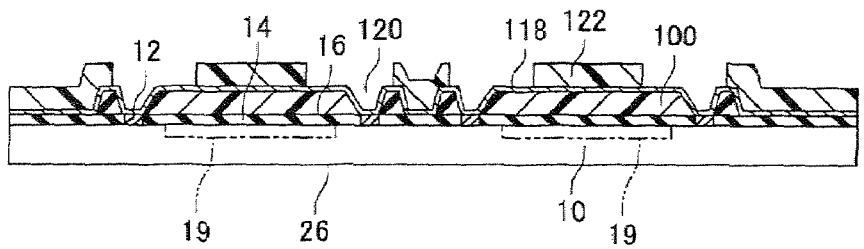

As illustrated in FIG. 6C, a plating resist layer 122 is formed to have on the conductive film 118 an opening 120 that exposes part of the conductive film 118.

The opening 120 of the plating resist layer 122 exposes part positioned over the electrode 12 as well as part continuously extending from the foregoing part in a shape of a wire, of the conductive film 118.

For other details on the plating resist layer 122, the content of description on the plating resist layer 22 with reference to FIG. 1B is applicable.

Figure 6D:
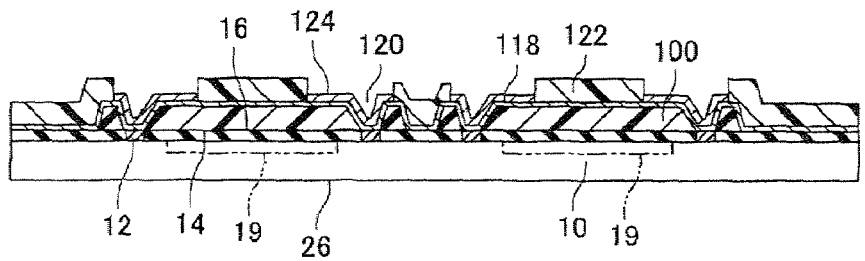

As illustrated in FIG. 6D, a metal layer 124 is formed on a portion of the conductive film 118 exposed from the plating resist layer 122 by electrolytic plating that applies an electric current to the conductive film 118.

For formation of the metal layer 124 by electrolytic plating, the content of description on the electrolytic plating and the metal layer 24 with reference to FIG. 1C is applicable.

Figure 6E:
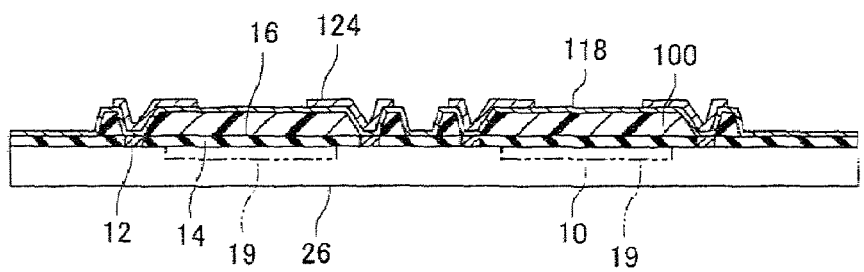

As illustrated in FIG. 6E, the plating resist layer 122 is removed.

Next, the resin layer 28 is formed on the second surface 26, which is on the side opposite to that of the first surface 16, of the semiconductor substrate 10.

In this process, the first surface 16 is turned toward the support 30 to bring the metal layer 124 into contact with the support 30.

The conductive film 118 may come into contact with the support 30.

Figure 7A:
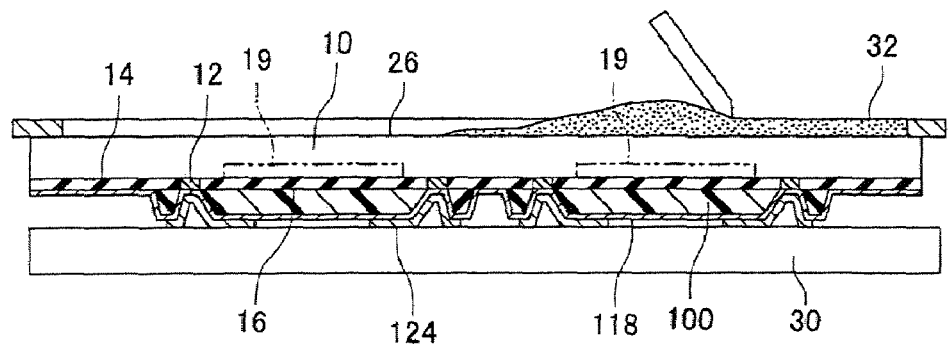
FIGS. 7A to 7C illustrate the method for manufacturing a semiconductor device according to the second embodiment of the invention.

As illustrated in FIG. 7A, the resin precursor layer 32 is formed on the second surface 26.

Figure 7B:
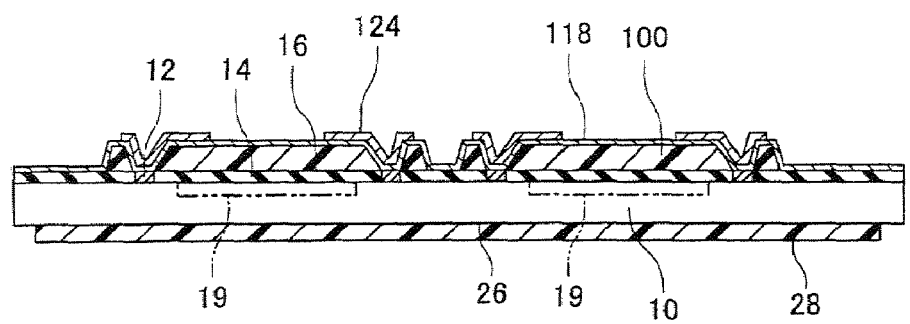

The resin precursor layer 32 is cured to form the resin layer 28 (see FIG. 7B).

For example, if a thermosetting resin is used as the resin precursor layer 32, the resin precursor layer 32 is heated and cured to form the resin layer 28.

Providing the resin layer 28 enables the second surface 26 of the semiconductor substrate 10 to be protected, and also enables the thin semiconductor substrate 10 to be reinforced.

For other details, the content of description with reference to FIGS. 2A and 2B is applicable.

Figure 7C:
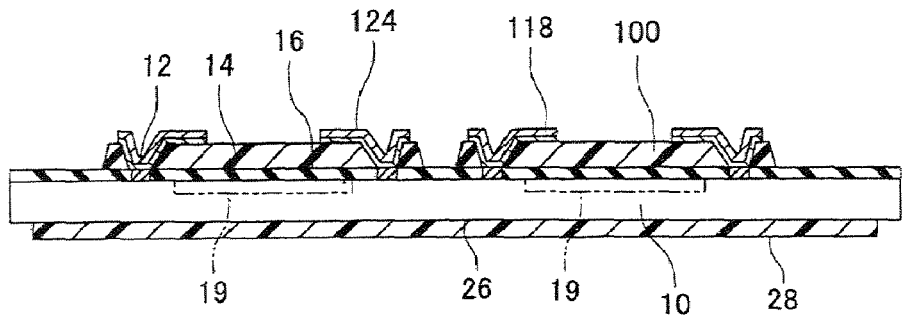

As illustrated in FIG. 7C, a portion of the conductive film 118 exposed from the metal layer 124 is removed by etching with the metal layer 124 functioning as a mask, and thus the surface of the metal layer 124 is polished by etching.

For the details and the effects, the content of description with reference to FIG. 2C is applicable.

In this embodiment, a wire electrically coupled to the electrode 12 is formed of the metal layer 124 and the conductive film 118.

Figure 8A:
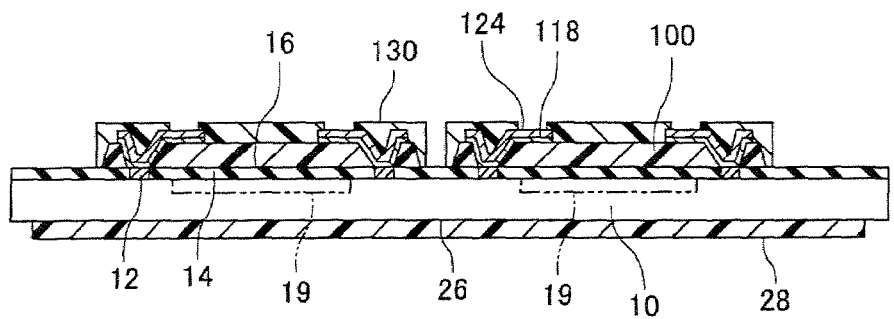
FIGS. 8A and 8B illustrate the method for manufacturing a semiconductor device according to the second embodiment of the invention.

As illustrated in FIG. 8A, a solder resist layer 130 is formed.

The solder resist layer 130 is formed in such a manner as to expose part (e.g. land) of the metal layer 124 and cover the entirety of the other part of the metal layer 124.

The solder resist layer 130 may be disposed on the stress relaxation layer 100.

Note that if the solder resist layer 130 is formed avoiding a cutting line of the semiconductor substrate 10, which will be described later, clogging of a cutter (or a scriber) can be prevented.

The solder resist layer 130 can be formed by using a photosensitive resin and by patterning and curing the resin in a photolithography, process.

If a thermosetting resin is used, the resin can be cured by heat.

Figure 8B:
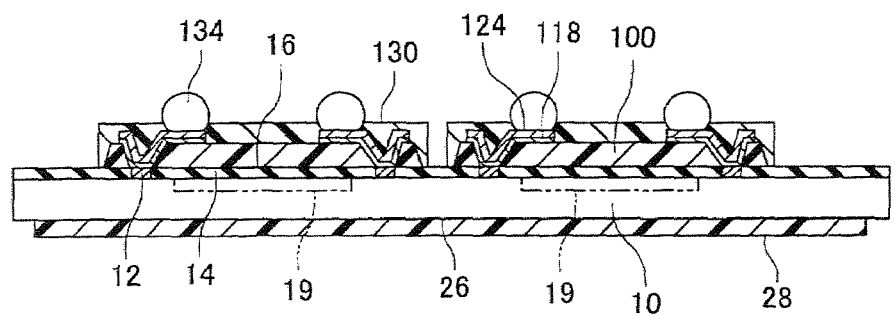

As illustrated in FIG. 8B, an external terminal 134 is formed on the metal layer 124.

For the details of the external terminal 134, the content of description with reference to FIG. 3 is applicable.

Figure 9:
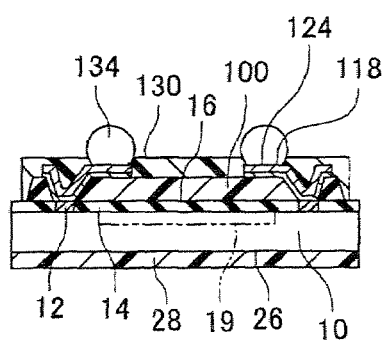
FIG. 9 illustrates the method for manufacturing a semiconductor device according to the second embodiment of the invention.

A semiconductor device (a flip-chip type semiconductor device) can be obtained by cutting (dicing or scribing) the semiconductor substrate 10 as illustrated in FIG. 9.

Modification of Second Embodiment

Figure 10A:
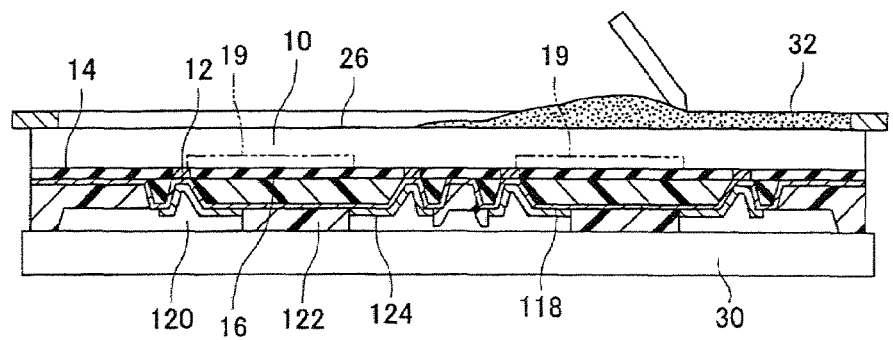
FIGS. 10A and 10B illustrate a modification of the second embodiment of the invention.
Figure 10B:
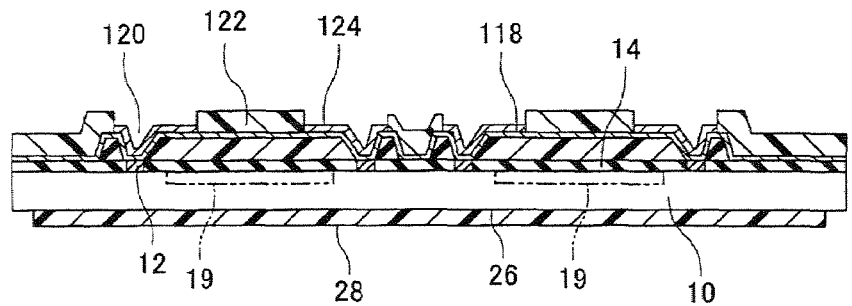

FIGS. 10A and 10B illustrate a modification of the second embodiment of the invention.

In this modification, the resin layer 28 is formed with the plating resist layer 122 having the opening 120 left without being removed as illustrated in FIG. 10A.

Specifically, the plating resist layer 122 is brought into contact with the support 30.

If the metal layer 124 is lower than the plating resist layer 122 in such a manner as not to protrude from the opening 120, the metal layer 124 will not come into contact with the support 30.

This can prevent the metal layer 124 from being damaged.

Regarding formation processes of the resin layer 28, the content of description with reference to FIG. 7A can be applied.

As illustrated in FIG. 10B, after the resin layer 28 is formed, the plating resist layer 122 is removed.

This modification can achieve the same effect as that described in the foregoing second embodiment (quoting the description on the first embodiment).

The invention is not limited to the aforementioned embodiments, and various modifications can be made.

For example, the invention includes configurations substantially the same as those described in the embodiments (e.g. configurations having the same function, method and result, or configurations having the same objective and result).

The invention also includes configurations in which an unsubstantial portion of the configuration described in the embodiment is replaced.

The invention also includes configurations that have the same effect or can achieve the same objective as those of the configurations described in the embodiments.

The invention also includes configurations in which a publicly-known technique is added to the configuration described in the embodiment.

What is claimed is:

1. A method for manufacturing a semiconductor device, comprising:
   (a) forming a conductive film on a first surface of a semiconductor substrate on which an electrode is formed, the semiconductor substrate having an integrated circuit, the electrode being electrically coupled to the integrated circuit, such that the electrode is covered by the conductive film, forming a plating resist layer on the conductive film such that the plating resist layer has an opening portion on a first part of the conductive film, and forming a metal layer on the first part of the conductive film by electrolytic plating, the electrolytic plating being performed by applying an electric current to the conductive film;
   (b) removing the plating resist layer after the step (a);
   (c) forming a resin layer on a second surface of the semiconductor substrate opposite to the first surface of the semiconductor substrate after the step (a); and
   (d) removing a second part of the conductive film by etching with the metal layer as a mask while etching a surface of the metal layer by the etching, after the steps (a), (b) and (c), the second part of the conductive film being exposed from the metal layer.

2. A method for manufacturing a semiconductor device, comprising:
   (a) forming a stress relaxation layer on a first surface of a semiconductor substrate on which an electrode is formed, the semiconductor substrate having an integrated circuit, the electrode being electrically coupled to the integrated circuit, forming a conductive film such that the stress relaxation layer and the electrode are covered by the conductive film, forming a plating resist layer on the conductive film such that the plating resist layer has an opening portion on a first part of the conductive film, and forming a metal layer on the first part of the conductive film by electrolytic plating, the electrolytic plating being performed by applying an electric current to the conductive film;
   (b) removing the plating resist layer after the step (a);
   (c) forming a resin layer on a second surface of the semiconductor substrate opposite to the first surface of the semiconductor substrate after the step (a); and
   (d) removing a second part of the conductive film by etching with the metal layer as a mask while etching a surface of the metal layer by the etching, after the steps (a), (b) and (c), the second part of the conductive film being exposed from the metal layer.

3. A method for manufacturing a semiconductor device, comprising:
   (a) forming a metal layer in an opening portion of a plating resist layer formed on a conductive film, the conductive film being formed on a first surface of a semiconductor substrate, the opening portion being positioned on a first part of the conductive film;
   (b) removing the plating resist layer after the forming of the metal layer;
   (c) forming a resin layer on a second surface of the semiconductor substrate opposite to the first surface of the semiconductor substrate after the forming of the metal layer; and
   (d) removing a second part of the conductive film by etching with the metal layer as a mask after the forming of the metal layer, the removing of the plating resist layer and the forming of the resin layer.

4. The method for manufacturing a semiconductor device according to claim 3, wherein
   a part of the metal layer is etched by the etching in the removing of the second part of the conductive film.

5. The method for manufacturing a semiconductor device according to claim 3, wherein
   the forming of the resin layer is performed by mounting the semiconductor substrate on the support so as to bring the metal layer into contact with the support.

6. The method for manufacturing a semiconductor device according to claim 3, wherein
   the removing of the plating resist layer is performed after the forming of the resin layer.

7. The method for manufacturing a semiconductor device according to claim 6, wherein
   the metal layer is formed so as to have a height equal to or less than a height of the plating resist layer.

8. A method for manufacturing a semiconductor device, comprising:
   (a) forming a metal layer in an opening portion of a plating resist layer formed on a conductive film formed so as to cover a first resin layer, the first resin layer being disposed on a first surface of a semiconductor substrate, the opening portion being positioned on a first part of the conductive film;
   (b) removing the plating resist layer after the forming of the metal layer;
   (c) forming a second resin layer on a second surface of the semiconductor substrate opposite to the first surface of the semiconductor substrate after the forming of the metal layer; and
   (d) removing a second part of the conductive film by etching with the metal layer as a mask after the forming of the metal layer, removing of the plating resist layer and the forming of the second resin layer.

9. The method for manufacturing a semiconductor device according to claim 8, wherein a part of the metal layer is etched by the etching in the removing of the second part of the conductive film.

10. The method for manufacturing a semiconductor device according to claim 8, wherein the forming of the resin layer is performed by mounting the semiconductor substrate on the support so as to bring the metal layer into contact with the support.

11. The method for manufacturing a semiconductor device according to claim 8, wherein the removing of the plating resist layer is performed after the forming of the resin layer.

12. The method for manufacturing a semiconductor device according to claim 11, wherein the metal layer is formed so as to have a height equal to or less than a height of the plating resist layer.

* * * * *